(12) United States Patent
Stulik

(10) Patent No.: US 10,187,077 B2
(45) Date of Patent: *Jan. 22, 2019

(54) PRECHARGE SWITCH-CAPACITOR CIRCUIT AND METHOD

(71) Applicant: TEXAS INSTRUMENTS INCORPORATED, Dallas, TX (US)

(72) Inventor: Paul Stulik, Tucson, AZ (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

This patent is subject to a terminal disclaimer.

(21) Appl. No.: 15/927,510

(22) Filed: Mar. 21, 2018

(65) Prior Publication Data

US 2018/0212615 A1  Jul. 26, 2018

Related U.S. Application Data

(63) Continuation of application No. 15/260,602, filed on Sep. 9, 2016, now Pat. No. 9,960,782.

(60) Provisional application No. 62/217,569, filed on Sep. 11, 2015.

(51) Int. Cl.
  *H03M 1/12* (2006.01)
  *H02M 3/07* (2006.01)
  *H03M 1/08* (2006.01)
  *H03M 1/06* (2006.01)
  *H03M 1/40* (2006.01)

(52) U.S. Cl.
  CPC ............. *H03M 1/124* (2013.01); *H02M 3/07* (2013.01); *H03M 1/06* (2013.01); *H03M 1/0863* (2013.01); *H03M 1/403* (2013.01)

(58) Field of Classification Search
  CPC .... H03M 1/06; H03M 1/0602–1/0624; H03M 1/0863–1/089; H03M 1/124
  See application file for complete search history.

(56) References Cited

U.S. PATENT DOCUMENTS

| 5,812,023 | A | 9/1998 | Jones |
| 5,841,310 | A | 11/1998 | Kalthoff et al. |
| 6,697,006 | B1 | 2/2004 | McCartney et al. |
| 7,047,148 | B1 | 5/2006 | Thomsen |
| 7,088,147 | B2 | 8/2006 | Prasad et al. |
| 7,545,296 | B2 | 6/2009 | Bult et al. |
| 7,786,767 | B2 | 8/2010 | Kushner et al. |
| 8,698,658 | B1* | 4/2014 | Ghatak ............... H03M 1/0607 341/118 |
| 9,224,499 | B2 | 12/2015 | Bogner |
| 9,425,818 | B1* | 8/2016 | Rajaee ................. H03M 3/32 |

(Continued)

*Primary Examiner* — Thomas J. Hiltunen
(74) *Attorney, Agent, or Firm* — John R. Pessetto; Charles A. Brill; Frank D. Cimino

(57) ABSTRACT

An input sampling stage circuit includes, a precharge buffer, a precharge switch-capacitor circuit, and an input sampling capacitor. The precharge buffer is configured to buffer an input voltage. The precharge switch-capacitor circuit includes a plurality of switches, a first capacitor, and a second capacitor configured such that the first and second capacitors are connected in series during a coarse sampling time and in parallel during a fine sampling time and charge transfer time. The input sampling capacitor is configured to sample the input voltage through the precharge switch-capacitor circuit during the coarse sampling time and sample the input voltage directly during the fine sampling time.

18 Claims, 8 Drawing Sheets

(56) References Cited

U.S. PATENT DOCUMENTS

| | | | |
|---|---|---|---|
| 9,571,118 B1 | 2/2017 | Gupta et al. | |
| 9,800,256 B2* | 10/2017 | Lee | H03M 1/466 |
| 2004/0183705 A1 | 9/2004 | Colonna et al. | |
| 2008/0252358 A1* | 10/2008 | Stulik | G11C 27/024 |
| | | | 327/427 |
| 2012/0068766 A1 | 3/2012 | Buter et al. | |
| 2013/0162455 A1* | 6/2013 | Mateman | G11C 27/026 |
| | | | 341/122 |
| 2014/0203958 A1* | 7/2014 | Okuda | H03M 1/124 |
| | | | 341/172 |
| 2016/0105194 A1* | 4/2016 | Kumbaranthodiyil | H03M 1/1245 |
| | | | 341/122 |
| 2017/0077803 A1* | 3/2017 | Stulik | H02M 3/07 |

* cited by examiner

US 10,187,077 B2

PRECHARGE SWITCH-CAPACITOR CIRCUIT AND METHOD

CROSS-REFERENCE TO RELATED APPLICATIONS

This continuation application claims priority to U.S. patent application Ser. No. 15/260,602, filed Sep. 9, 2016, which application claims priority to and the benefit of Provisional Patent Application No. 62/217,569, filed Sep. 11, 2015, both applications of which are hereby incorporated herein by reference in their entirety.

BACKGROUND

A switched-capacitor circuit is an electrical circuit that moves charge into and out of capacitors when switches are closed and opened. An increasing number of modern analog and mixed-signal integrated circuits, such as analog-to-digital converters, amplifiers, and analog filters, use switched-capacitor circuits as basic building blocks. The continued demand for improved performance of such analog and mixed-signal circuits has resulted in more stringent requirements for the switched-capacitor circuits.

SUMMARY

The problems noted above are solved in large part by systems and methods of sampling voltage in a switch-capacitor circuit. In some embodiments, a switch-capacitor circuit includes an input sampling stage circuit and an output stage circuit. The input sampling stage circuit includes a precharge buffer, a precharge switch-capacitor circuit, and an input sampling capacitor. The precharge buffer is configured to buffer an input voltage. The precharge switch-capacitor circuit includes a plurality of switches, a first capacitor, and a second capacitor configured such that the first and second capacitors are connected in series during a coarse sampling time and in parallel during a fine sampling time and charge transfer time. The input sampling capacitor is configured to sample the input voltage through the precharge switch-capacitor circuit during the coarse sampling time and sample the input voltage directly during the fine sampling time.

Another illustrative embodiment is a switch-capacitor circuit that includes an input sampling stage circuit and an output stage circuit. The input stage sampling circuit includes, a precharge buffer, a precharge switch-capacitor circuit, and an input sampling capacitor. The precharge buffer is configured to buffer an input voltage. The precharge switch-capacitor circuit includes a plurality of switches, a first capacitor, and a second capacitor configured such that the first and second capacitors are connected in parallel during a first portion of a coarse sampling time, in series during a second portion of the coarse sampling time, and in parallel during a fine sampling time and charge transfer time. The input sampling capacitor is configured to sample the input voltage through the precharge switch-capacitor circuit during the coarse sampling time and sample the input voltage directly during the fine sampling time.

Yet another illustrative embodiment is an input sampling stage circuit that includes a precharge buffer and a precharge switch-capacitor circuit. The precharge buffer is configured to buffer an input voltage and settle during a fine sampling time and a charge transfer time. The precharge switch-capacitor circuit includes a plurality of switches, a first capacitor, and a second capacitor configured such that an input sampling capacitor samples the input voltage through the precharge switch-capacitor circuit during the coarse sampling time. The plurality of switches, first capacitor, and second capacitor are also configured such that the input sampling capacitor samples the input voltage directly during the fine sample time. The plurality of switches, first capacitor, and second capacitor are also configured such that the input sampling capacitor discharges stored charge to an output stage circuit during the charge transfer time.

BRIEF DESCRIPTION OF THE DRAWINGS

For a detailed description of various examples, reference will now be made to the accompanying drawings in which.

NOTATION AND NOMENCLATURE

Figure 1:
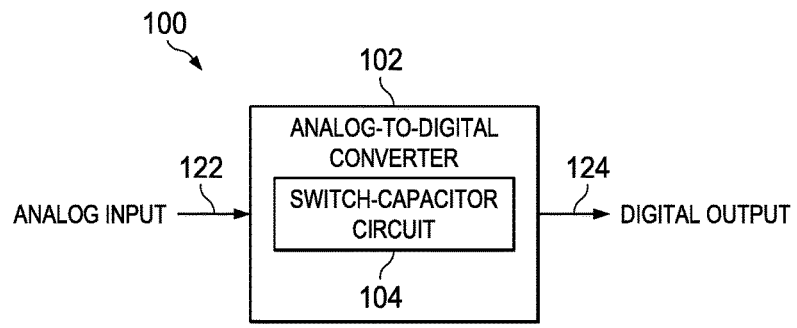
FIG. 1 shows an illustrative block diagram of analog-to-digital system that includes a switch-capacitor circuit in accordance with various embodiments.

Certain terms are used throughout the following description and claims to refer to particular system components. As one skilled in the art will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection, or through an indirect connection via other devices and connections. The recitation "based on" is intended to mean "based at least in part on." Therefore, if X is based on Y, X may be based on Y and any number of other factors.

DETAILED DESCRIPTION

The following discussion is directed to various embodiments of the disclosure. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

The fundamental problem which often limits precision in switched-capacitor circuits is the effect of loading from the input circuitry. Faster sampling frequency and/or a larger input sampling capacitor in the input stage of some conventional switched-capacitor circuits results in lower input impedance. Ideally, the no load voltage produced by the input circuitry and the voltage at the input of the switched-capacitor circuit is equal. However, due to the input circuitry impedance and the switched-capacitor circuit input impedance the voltages are not equal. Instead an error term causes the no-load voltage to not equal the voltage at the input of the switched-capacitor circuit. This error term limits the accuracy of three important performance metrics: 1) gain error, 2) gain error temperature drift, and 3) non-linearity.

To improve input impedance of the switched-capacitor circuit and thereby improve the above listed performance metrics, some conventional switched-capacitor circuits include a precharge buffer. In these circuits, the input voltage is first "coarse" sampled during a first phase on a sampling capacitor through the precharge buffer and a coarse sampling switch. Immediately following this first phase, the input voltage is directly "fine" sampled during a second phase on the sampling capacitor through a second fine sampling switch. The charge stored on the sampling capacitor during the coarse and fine sampling phases is then transferred during a third phase to an output stage circuit. This process repeats itself over a sampling period. In a typical conventional switched-capacitor circuit, approximately 50% of the sampling period is allotted to the sampling phases (the first and second phases) while 50% of the sampling period is allotted to the charge transfer phase (the third phase). Furthermore, the fine sampling phase (the second phase) is approximately three times longer than the coarse sampling phase (the first phase) in the typical conventional switched-capacitor circuit so that the fine sampling process has sufficient time to settle to the required accuracy. Because these circuits utilize a precharge buffer to coarse charge the sampling capacitor to a precharge buffer output approximately equal in value to the input voltage, these circuits provide higher input impedance. However, these circuits have a much higher power dissipation arising from the need to quickly settle the precharge buffer output during the short duration of the coarse sampling phase. In fact, there is a direct relationship between the precharge buffer power dissipation and the fraction of the sampling period allotted to precharge buffer settling. The higher the percentage (fraction) of the sampling period allotted to the precharge buffer settling, the lower the precharge buffer power dissipation. Therefore, it is desirable to develop a switched-capacitor circuit that has a longer percentage of the sampling period allotted to precharge buffer settling while maintaining a high input impedance.

FIG. 1 shows an illustrative block diagram of analog-to-digital system 100 that includes a switch-capacitor circuit 104 in accordance with various embodiments. The analog-to-digital system 100 includes the analog-to-digital converter (ADC) 102 which includes the switch-capacitor circuit 104. In some embodiments, ADC 102 is configured to receive an analog input signal 122 and convert the analog input signal 122 into digital output signal 124. ADC converter 102 may be any type of ADC including a direct-conversion ADC, a ramp-compare ADC, an integrating ADC, a pipeline ADC, a delta-sigma ADC, a successive-approximation ADC, and/or a time-interleaved ADC. The ADC 102 may include switch-capacitor circuit 104. Switch-capacitor circuit 104 is configured to sample the analog input signal 122 and then transfer the resulting charge to a subsequent stage so that the analog signal may be converted into a digital signal. While switch-capacitor circuit 104 is shown as being included in ADC 102, in other embodiments, switch-capacitor circuit 104 may be included in other analog and/or mixed-signal integrated circuits such as an amplifier and/or an analog filter.

Figure 2A:
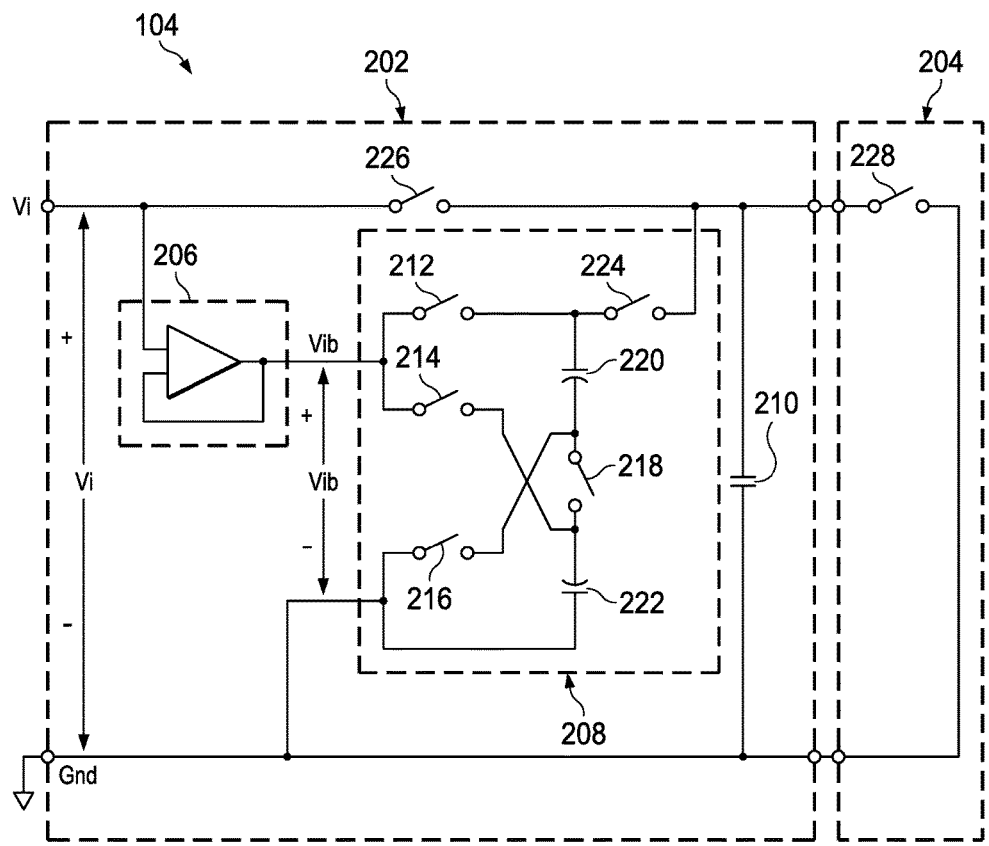
FIG. 2A shows an illustrative circuit diagram of a switch-capacitor circuit in accordance with various embodiments.

FIG. 2A shows an illustrative circuit diagram of switch-capacitor circuit 104 in accordance with various embodiments. In FIG. 2A, the switch-capacitor circuit 104 is in a single-ended configuration. Switch-capacitor circuit 104 may include a single-ended switch capacitor input sampling stage circuit 202 and a single-ended switch capacitor output stage circuit 204. The output stage circuit 204 is representative of the internal discharging process within a larger circuit block such as an integrator, amplifier, or filter. The actual circuitry inside output stage circuit 204 may be different, but the net effect may be the same as shown in FIG. 2A.

The single-ended switch capacitor input sampling stage circuit 202 may include a precharge buffer 206, a precharge switch-capacitor circuit 208 a fine sampling switch 226, and an input sampling capacitor 210. The precharge buffer 206 may include a buffer amplifier configured to buffer an input voltage Vi. In other words, the precharge buffer 206 is configured to provide electrical impedance transformation of the signal Vi and output the voltage Vib. The precharge switch-capacitor circuit 208 may include the switches 212-216, the capacitor connecting switch 218, the coarse sampling switch 224, and capacitors 220 and 222.

The single-ended configuration shown in FIG. 2A first samples the precharge buffer output Vib on the switch-capacitor circuit 208 capacitors 220 and 222 through switches 212, 214, and 216 for the duration of phase P3 (the time that the input sampling capacitor 210 is not coarse sampling; i.e., during the fine sampling time and charge transfer time). Thus, during the duration of P3, switches 212-216 are closed. A portion of the charge stored on capacitors 220 and 222 is then transferred to input sampling capacitor 210 through coarse sampling switch 224 and capacitor connecting switch 218 during a coarse sampling time ("phase P1c"). Thus, during P1c, coarse sampling switch 224 and capacitor connecting switch 218 are closed while switches 212-216, fine sampling switch 226, and modeling switch 228 of the output stage circuit 204 are open. Hence, the capacitors 220 and 222 are connected in series during P1c. The input voltage Vi is then fine sampled during fine sampling time ("phase P1f") on the input sampling capacitor 210 through fine sampling switch 226 for the duration of phase P1f. Thus, during P1f, the fine sampling switch 226 and switches 212-216 are closed while coarse sampling switch 224, capacitor connecting switch 218, and modeling switch 228 of the output stage circuit 204 are open. Hence, the capacitors 220 and 222 are connected in parallel during P1f. The charge stored on input sampling capacitor 210 during the coarse and fine sampling process is then transferred during charge transfer time ("phase P2") to the output stage modeled by switch 228. Thus, during phase P2, the modeling switch 228 of the output stage circuit 204 and switches 212-216 are closed while the fine sampling switch 226, coarse sampling switch 224, and capacitor connecting switch 218 are open. This coarse/fine sampling and charge transfer process repeats with sampling period (ts).

Figure 2B:
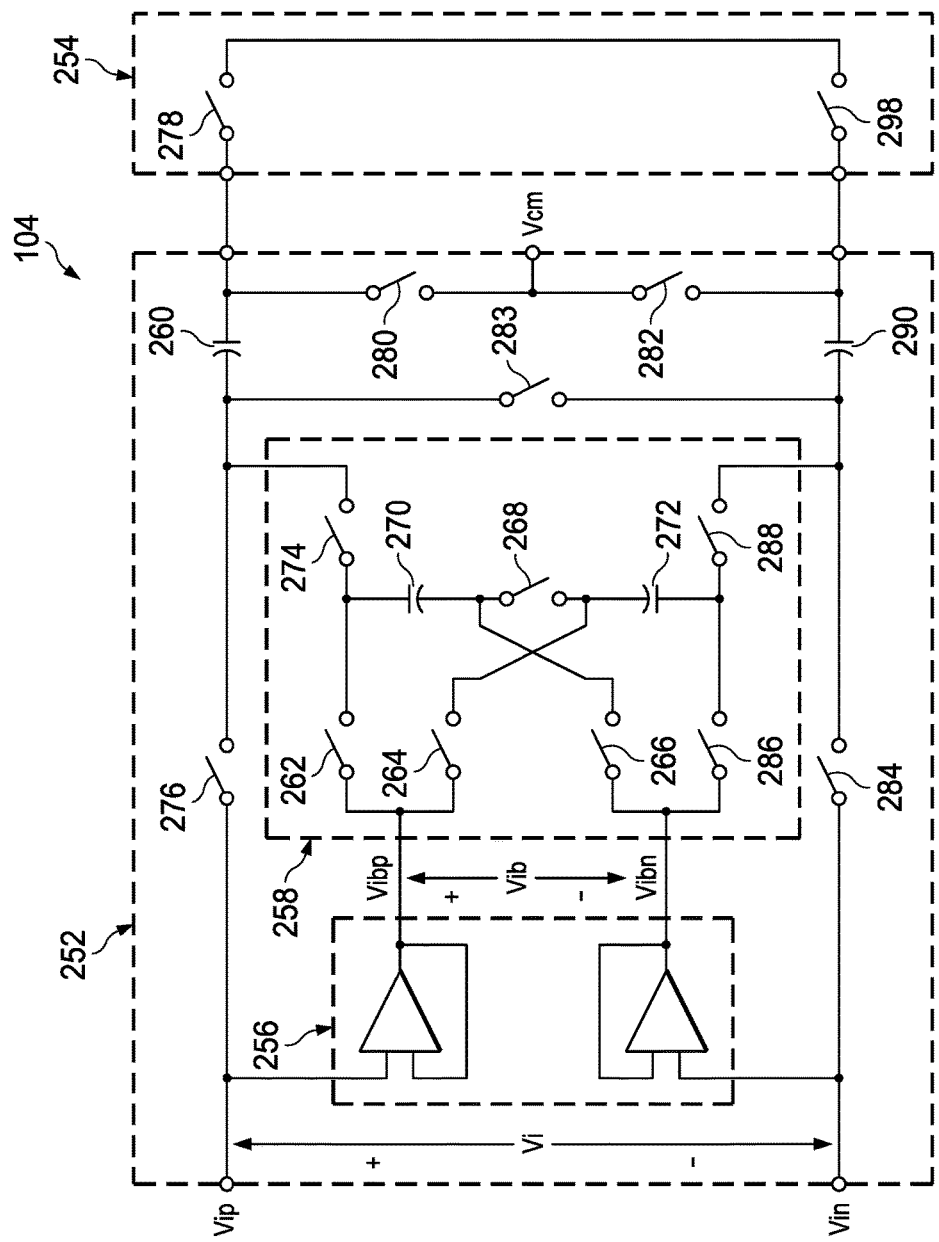
FIG. 2B shows an illustrative circuit diagram of a switch-capacitor circuit in accordance with various embodiments.

FIG. 2B shows an illustrative circuit diagram of switch-capacitor circuit 104 in accordance with various embodiments. In FIG. 2B, the switch-capacitor circuit 104 is in a differential mode configuration. Switch-capacitor circuit 104 may include a differential switch capacitor input sampling stage circuit 252 and a differential switch capacitor output stage circuit 254. The output stage circuit 254 is representative of the internal discharging process within a larger circuit block such as an integrator, amplifier, or filter. The actual circuitry inside output stage circuit 254 may be different, but the net effect may be the same as shown in FIG. 2B.

The differential switch capacitor input sampling stage circuit 252 may include a precharge buffer 256, a precharge switch-capacitor circuit 258, fine sampling switches 276 and 284, input sampling capacitors 260 and 290, and switches 280, 282, and 283. The precharge buffer 256 may include two buffer amplifiers. One of the buffer amplifiers is configured to buffer an input voltage Vip. In other words, one of the buffer amplifiers of precharge buffer 256 is configured to provide electrical impedance transformation of the signal Vip and output the voltage Vibp. The second of the buffer amplifiers is configured to buffer an input voltage Vin. In other words, the second of the buffer amplifiers of precharge buffer 256 is configured to provide electrical impedance transformation of the signal Vin and output the voltage Vibn. The voltages Vip and Vin may be differential voltages. Hence, the voltages Vip and Vin may be a pair of the same voltage signal, except that the differential pair of signals are 180 degrees out of phase with each other. Thus, the amplitude of the two signals Vip and Vin that make up the differential voltage is the same; however, the phase of the two signals is different. Therefore, the voltage Vip may be referred to as a positive input voltage and the voltage Vin may be referred to as a negative input voltage. Similarly, the buffer amplifier output voltages Vibp and Vibn may be differential voltages. The precharge switch-capacitor circuit 258 may include the switches 262-266 and 286, the capacitor connecting switch 268, the coarse sampling switches 274 and 288, and capacitors 270 and 272.

The differential configuration shown in FIG. 2B first samples the precharge buffer output (Vibp and Vibn) on precharge switch-capacitor circuit 258 capacitors 270 and 272 through switches 262, 264, 266, and 286 for the duration of phase P3. Thus, during the duration of P3, switches 262-266 and 286 are closed. A portion of the charge stored on capacitors 270 and 272 is then transferred to input sampling capacitors 260 and 290 through coarse sampling switches 274 and 288, capacitor connecting switch 268, and switches 280 and 282 during the coarse sampling time (phase P1c). Thus, during P1c, coarse sampling switches 274 and 288, capacitor connecting switch 268, and switches 280 and 282 are closed while switches 262-266, 286, and 283, fine sampling switches 276 and 284, and modeling switches 278 and 298 of the output stage circuit 254 are open. Hence, the capacitors 270 and 272 are connected in series during P1c. The input (Vip and Vin) is then fine sampled during the fine sampling time (phase P1f) on the input sampling capacitors 260 and 290 through fine sampling switches 276 and 284 and switches 280 and 282 for the duration of phase P1f. Thus, during P1f, the fine sampling switches 276 and 284 and switches 262-266, 286, 280, and 282 are closed while coarse sampling switches 274 and 288, capacitor connecting switch 268, switch 283, and modeling switches 278 and 298 of the output stage circuit 254 are open. Hence, the capacitors 270 and 272 are connected in parallel during P1f. The charge stored on input sampling capacitors 260 and 290 during the coarse and fine sampling process is then transferred during the charge transfer time (phase P2) to the output stage circuit 254 modeled by switches 283, 278, and 298. Thus, during phase P2, the modeling switches 278 and 298 of the output stage circuit 254 and switches 262-266, 286, and 283 are closed while the fine sampling switches 276 and 284, coarse sampling switches 274 and 288, capacitor connecting switch 268, and switches 280 and 282 are open. This coarse/fine sampling and charge transfer process repeats with sampling period (ts).

Figure 3:
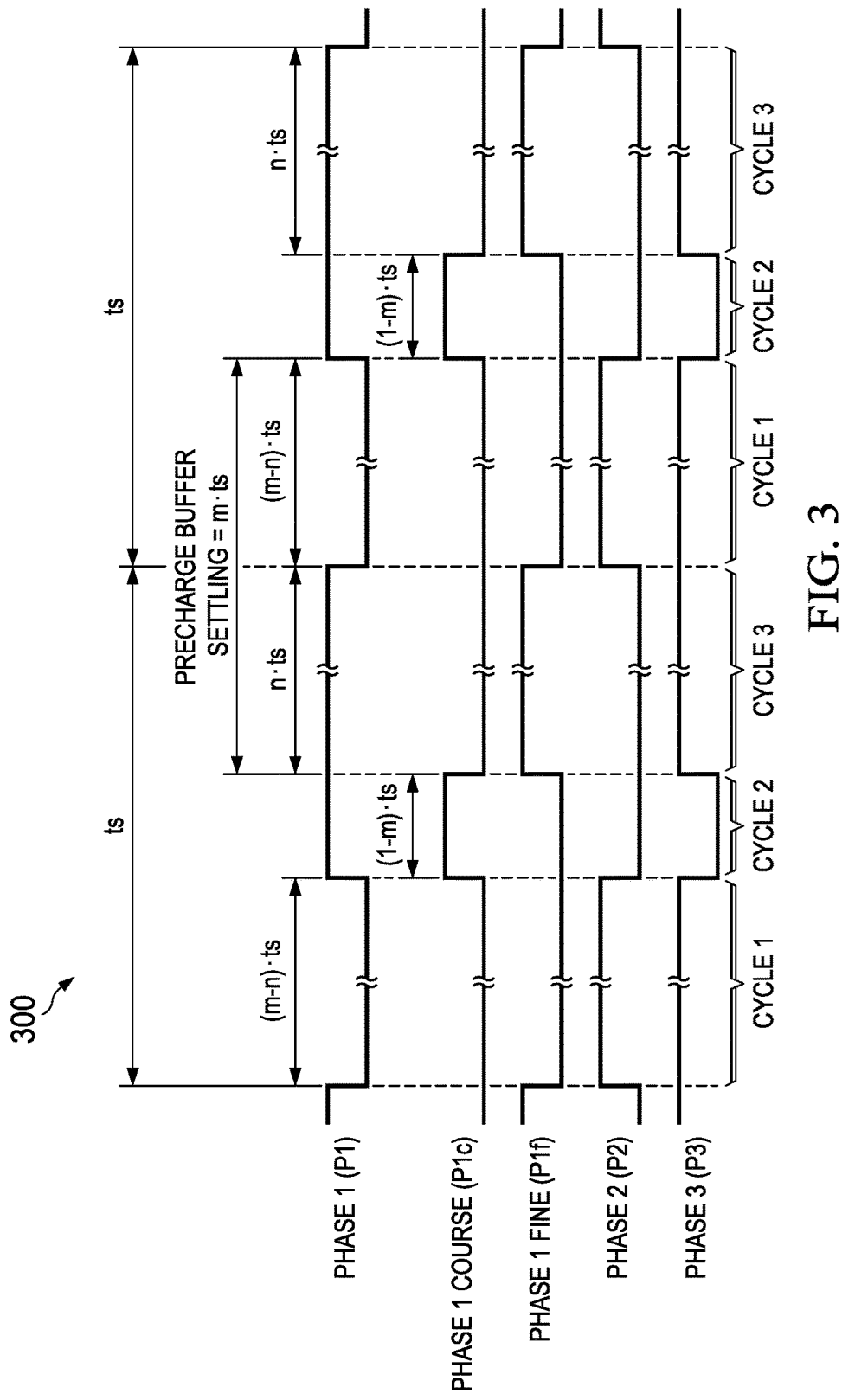
FIG. 3 shows an illustrative timing diagram of switch timing for switches in a switch-capacitor circuit in accordance with various embodiments.

FIG. 3 shows an illustrative timing diagram 300 of switch timing for switches in switch-capacitor circuit 104 in accordance with various embodiments. More particularly, the timing diagram 300 shows the timing of when the various phases discussed above occur. A HIGH signal in timing diagram 300 indicates that the corresponding phase is occurring and, thus, the switches are closed or open as discussed above. As shown in timing diagram 300, the switch-capacitor circuit 104 goes through three cycles (cycles 1, 2, and 3). The three cycles correspond with times when the switches may open or close. For example, cycle 1 corresponds to phase 2 (the charge transfer time when charge stored on the input sampling capacitor 210 from FIG. 2A and/or input sampling capacitors 260 and 290 from FIG. 2B is transferred to the output stage circuit). In addition to corresponding to phase 2, cycle 1 also corresponds with phase 3 (the time the precharge buffer 206 from FIG. 2A and 256 from FIG. 2B settles) because phase 3 occurs at all times except during the coarse sampling time. Cycle 1 lasts for a duration that may be defined by (m−n)·ts where ts is sampling period, m is the percent of the sampling period that a precharge buffer is settling (i.e., the percent of the sampling period that includes phase 3), and n is the percent of the sampling period that includes the fine sampling time (i.e., the percent of the sampling period that includes P1f).

Cycle 2 corresponds with P1c (the coarse sampling time). In addition to corresponding to P1c, cycle 2 also corresponds with phase 1 (the time that voltage is being sampled onto the input sampling capacitor 210 from FIG. 2A or input sampling capacitors 260 and 290 from FIG. 2B). Cycle 2 lasts for a duration that may be defined by (1−m)·ts. Cycle 3 corresponds with P1f (the fine sampling time). In addition to corresponding to P1f, cycle 3 also corresponds with phase 1 and phase 3. Cycle 3 lasts for a duration that may be defined by n·ts. By providing suitable switch timing which allows for the precharge buffer to settle its output for much larger fraction of sampling period (m), switch-capacitor circuit 104 provides the benefit of increasing the input impedance of the switched-capacitor circuit while at the same time minimizing the power dissipation of the precharge buffer.

Figure 4:
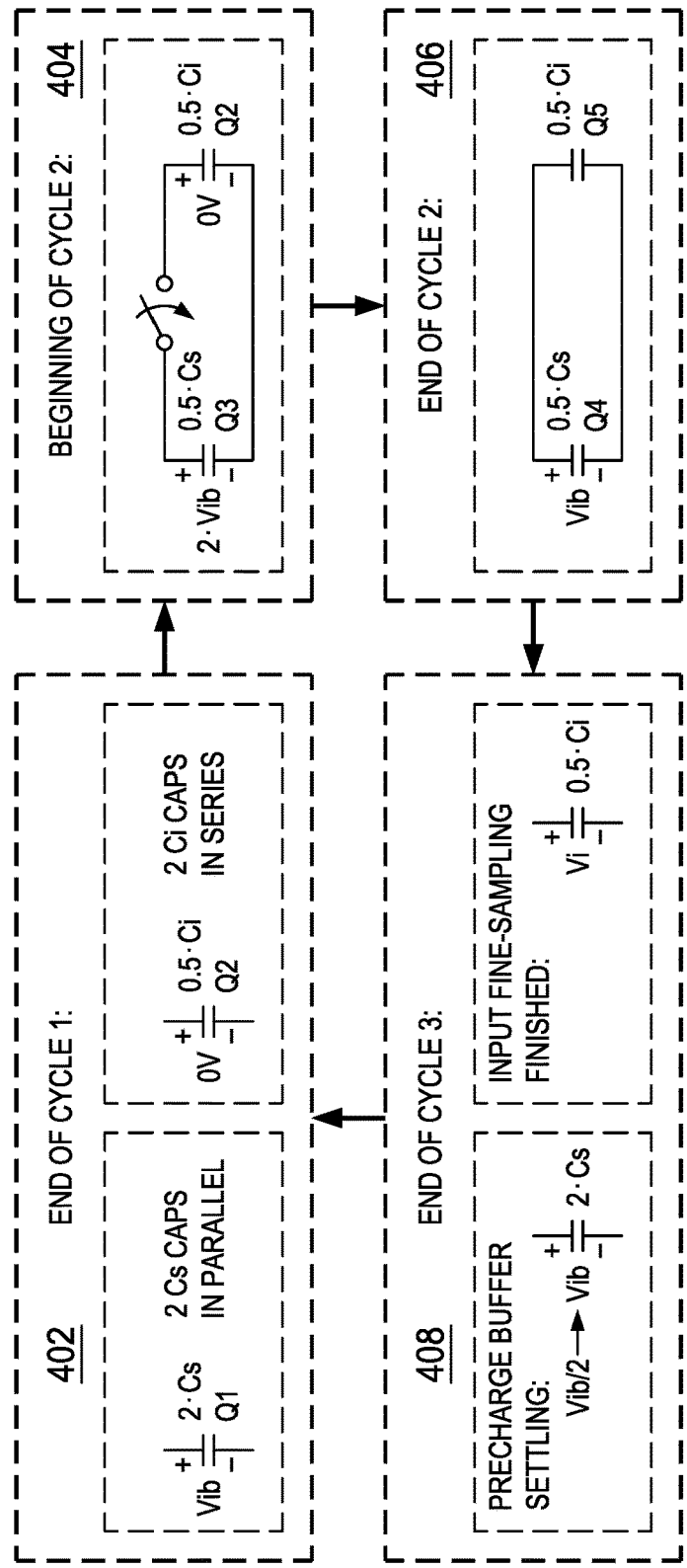
FIG. 4 shows an illustrative block diagram of time events and associated states of capacitor voltages and charges in a switch-capacitor circuit in accordance with various embodiments.

FIG. 4 shows an illustrative block diagram of time events 402-408 and associated states of capacitor voltages and charges in a switch-capacitor circuit 104 described in FIGS. 2A and 2B in accordance with various embodiments. For proper operation of the switch-capacitor circuit 104, it is necessary to size the capacitors 220-222 correctly relative to the input sampling capacitor 210 from FIG. 2A and the capacitors 270-272 correctly relative to input sampling capacitors 260 and 290 from FIG. 2B. There are four separate time events 402-408 and associated states of all capacitor voltages and charges. For simplification, the following substitutions are used throughout the discussion of FIG. 4 which focuses on the differential design shown in FIG. 2B: $C_{270}$ (capacitance of capacitor 270)=$C_{272}$ (capacitance of capacitor 272)=Cs and $C_{260}$ (capacitance of capacitor 260)=$C_{290}$ (capacitance of capacitor 290)=Ci.

First event 402 is at the end of cycle 1 during which equivalent capacitor 2·Cs (as capacitors 270 and 272 are in parallel) has sampled precharge buffer output voltage Vib and equivalent capacitor 0.5·Ci (as the capacitors 260 and 290 are in series) has been discharged by the output stage circuit to 0V. The charges on the capacitors are:

$$Q1=2\cdot Cs\cdot Vib \quad (1)$$

$$Q2=0 \quad (2)$$

where Q1 is the charge on the equivalent capacitor 2·Cs and Q2 is the charge on the equivalent capacitor 0.5·Ci at the end of cycle 1.

Second event 404 is at the beginning of cycle 2 during which capacitors 270 and 272 have been connected in series due to the switching discussed above and the resulting equivalent capacitor 0.5·Cs has voltage of 2·Vib across its terminals and has a charge of:

$$Q3=Cs\cdot Vib \quad (3)$$

Third event 406 is at the end of cycle 2 during which equivalent capacitors 0.5·Cs and 0.5·Ci have been connected in parallel and the desired voltage Vib is assumed across them. The charges on the capacitors are:

$$Q4=0.5\cdot Cs\cdot Vib \quad (4)$$

$$Q5=0.5\cdot Ci\cdot Vib \quad (5)$$

where Q4 is the charge on the equivalent capacitor 0.5·Cs and Q5 is the charge on the equivalent capacitor 0.5·Ci at the end of cycle 2. From the charge conservation principle:

$$Q3+Q2=Q4+Q5 \quad (6)$$

Substituting Equations 2-5 in Equation 6 and simplifying results in:

$$Cs=Ci \quad (7)$$

Thus, the capacitors 270 and 272 are equal in capacitance to input sampling capacitors 260 and 290. Hence, $C_{270}=C_{272}=C_{260}=C_{290}$.

Fourth event 408 is at the end of cycle 3 during which the equivalent input-sampling capacitor 0.5·Ci has finished the fine sampling process. At this time the equivalent 2·Cs capacitor is still settling from Vib/2 to Vib.

Applying the above analysis (Equations 1-6) to the single-ended configuration of FIG. 2A results in the same relative capacitances of the capacitors 220-222 and half the input sampling capacitor 210. Thus, because there is only a single input sampling capacitor, $C_{220}=C_{222}=0.5\cdot C_{210}$ Since the coarse sampling phase P1c only involves capacitor charge re-distribution (i.e., it only involves capacitors and switches), coarse sampling can be done in very short amount of time, in some embodiments in about 0.05·ts. This leaves a much longer time, in some embodiments about 0.95·ts, for precharge buffer settling during phase 3. Since the precharge buffer settling time is increased in comparison to the precharge buffer settling time of the conventional switch-capacitor circuit (typically about 0.125·ts), precharge buffer power dissipation can be reduced by a factor of approximately 14. Furthermore, the fine sampling phase is also lengthened, in some embodiments to approximately 0.45·ts from the conventional switch-capacitor circuit fine sampling time (typically about 0.375·ts) providing a 20% increase in fine sampling time.

Peak voltage ($V_{PEAK}$) of 2·Vib across series-connected capacitors 220-222 from FIG. 2A and capacitors 270-272 from FIG. 2B is used at the beginning of cycle 2. $V_{PEAK}$=2·Vib has been used to simplify the calculations in Equations 3-7. In a real switch-capacitor circuit 104, $V_{PEAK}$=2·Vib represents an upper limit value of the voltage. One technique to minimize $V_{PEAK}$ is to sequence the timing of switching (shown in FIG. 3) such that the rising edge of phase P1c occurs after the rising edge of phase P1. A second technique to minimize $V_{PEAK}$ is to design the switches such that the RON ($S_{274}+S_{288}+S_{280}+S_{282}$) RON ($S_{268}$), where RON refers to switch on-resistance. Even with both of these techniques applied, practical implementation of switch-capacitor circuit 104 shown in FIGS. 2A-2B may not be able to the reduce $V_{PEAK}$ factor by more than about 0.75 and consequently $V_{PEAK} \approx 0.75 \cdot 2 \cdot Vib$. Practical implementations of the switch-capacitor circuits 104 of FIGS. 2A and 2B therefore have $V_{PEAK} \approx 1.5 \cdot Vib$. Peak voltages which are more than diode turn-on voltage above $V_{DD}$ will turn on the normally reverse-biased diodes found in PMOS devices that may form the switches which are exposed to $V_{PEAK} \approx 1.5 \cdot Vib$. These turned-on diodes will then leak some of the charge stored on capacitors 220-222 from FIG. 2A and capacitors 270-272 from FIG. 2B to $V_{DD}$ rail and thus degrade the circuit performance.

Figure 5A:
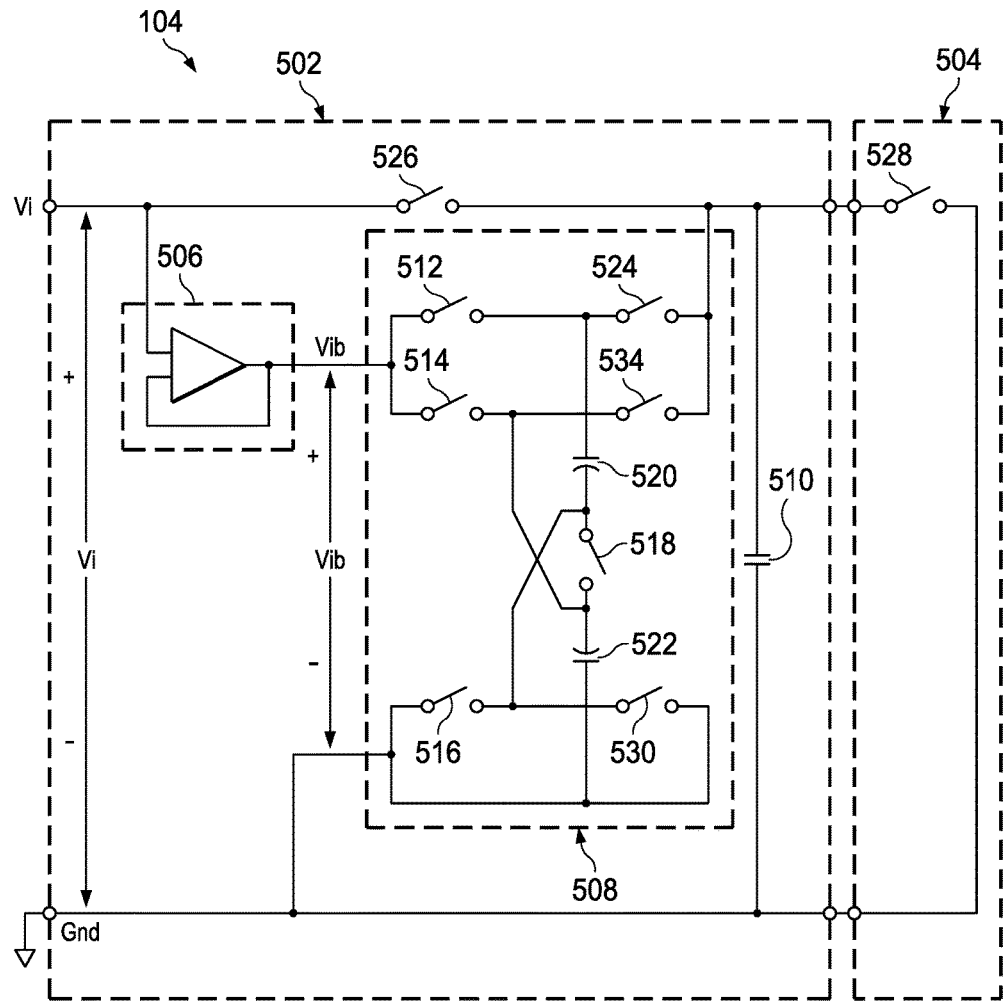
FIG. 5A shows an illustrative circuit diagram of a switch-capacitor circuit in accordance with various embodiments.

FIG. 5A shows an illustrative circuit diagram of switch-capacitor circuit 104 in accordance with various embodiments. In FIG. 5A, the switch-capacitor circuit 104 is in a single-ended configuration. Switch-capacitor circuit 104 may include a single-ended switch capacitor input sampling stage circuit 502 and a single-ended switch capacitor output stage circuit 504. The output stage circuit 504 is representative of the internal discharging process within a larger circuit block such as an integrator, amplifier, or filter. The actual circuitry inside output stage circuit 504 may be different, but the net effect may be the same as shown in FIG. 5A.

The single-ended switch capacitor input sampling stage circuit 502 may include a precharge buffer 506, a precharge switch-capacitor circuit 508 a fine sampling switch 526, and an input sampling capacitor 510. The precharge buffer 506 may include a buffer amplifier configured to buffer an input voltage Vi. In other words, the precharge buffer 506 is configured to provide electrical impedance transformation of the signal Vi and output the voltage Vib. The precharge switch-capacitor circuit 508 may include the switches 512-516, the capacitor connecting switch 518, the coarse sampling switch 524, switches 530 and 534, and capacitors 520 and 522.

In contrast to circuit of FIG. 2A, which transfers the required charge from capacitor 220 and 222 to input sampling capacitor 210 in a single step during phase P1c, the single-ended precharge switch-capacitor circuit 508 of FIG. 5A transfers the required charge from capacitors 520 and 522 to input sampling capacitor 510 in two separate steps. The first step, which occurs during a subset of the coarse sampling time (phase P1ca), transfers the first portion of the charge from parallel-connected capacitors 520 and 522 to input sampling capacitor 510 through coarse sampling switch 524 and switches 530 and 534. The second step, which occurs during a second subset of the coarse sampling time (phase P1cb), transfers the second portion of the charge from series-connected capacitors 520 and 522 to input sampling capacitor 510 through coarse sampling switch 524 and capacitor connecting switch 518.

The single-ended configuration shown in FIG. 5A first samples the precharge buffer output Vib on the switch-capacitor circuit 508 capacitors 520 and 522 through switches 512, 514, and 516 for the duration of phase P3 (the time that the input sampling capacitor 510 is not coarse sampling; i.e., during the fine sampling time and charge transfer time). Thus, during the duration of P3, switches 512-516 are closed. A first portion of the charge stored on capacitors 520 and 522 is then transferred to input sampling capacitor 510 through coarse sampling switch 524 and switches 530 and 534 during a phase P1ca. Thus, during P1ca, coarse sampling switch 524 and switches 530 and 534 are closed while switches 512-516, capacitor connecting switch 518, fine sampling switch 526, and modeling switch 528 of the output stage circuit 504 are open. Hence, the capacitors 520 and 522 are connected in parallel during P1ca. A second portion of the charge from capacitors 520 and 522 is then transferred to input sampling capacitor 510 through coarse sampling switch 524 and capacitor connecting switch 518 during phase P1cb. Thus, during P1cb, coarse sampling switch 524 and connecting capacitor switch 518 are closed while switches 512-516, 530, and 534, fine sampling switch 526, and modeling switch 528 of the output stage circuit 504 are open. Hence, the capacitors 520 and 522 are connected in series during P1cb. The input voltage Vi is then fine sampled during fine sampling time ("phase P1f") on the input sampling capacitor 510 through fine sampling switch 526 for the duration of phase P1f. Thus, during P1f, the fine sampling switch 526 and switches 512-516 are closed while coarse sampling switch 524, capacitor connecting switch 518, switches 530 and 534, and modeling switch 528 of the output stage circuit 504 are open. Hence, the capacitors 520 and 522 are connected in parallel during P1f. The charge stored on input sampling capacitor 510 during the coarse and fine sampling process is then transferred during charge transfer time ("phase P2") to the output stage modeled by switch 528. Thus, during phase P2, the modeling switch 528 of the output stage circuit 504 and switches 512-516 are closed while the fine sampling switch 526, coarse sampling switch 524, capacitor connecting switch 518, and switches 530 and 534 are open. This coarse/fine sampling and charge transfer process repeats with sampling period (ts).

Figure 5B:
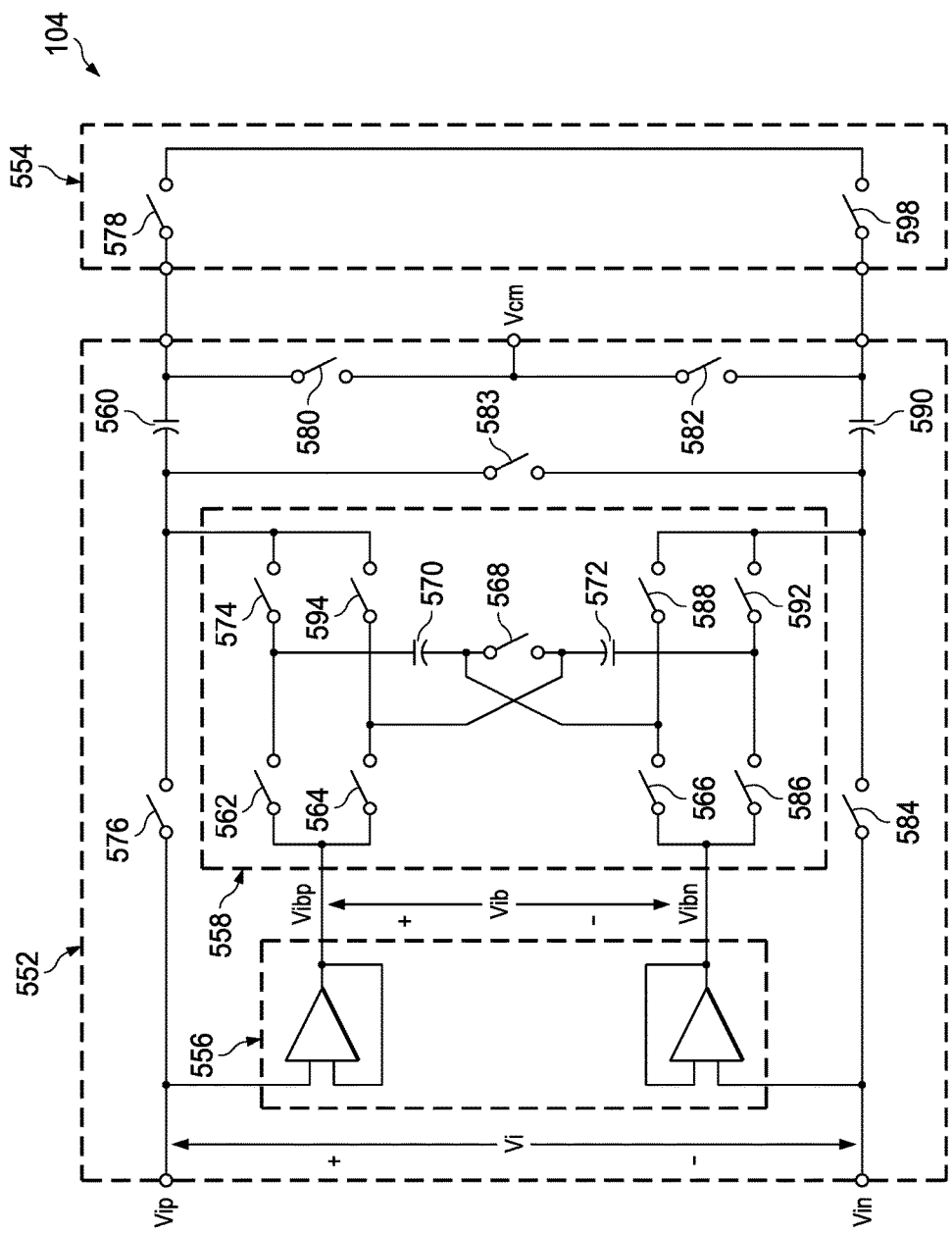
FIG. 5B shows an illustrative circuit diagram of a switch-capacitor circuit in accordance with various embodiments.

FIG. 5B shows an illustrative circuit diagram of switch-capacitor circuit 104 in accordance with various embodiments. In FIG. 5B, the switch-capacitor circuit 104 is in a differential mode configuration. Switch-capacitor circuit 104 may include a differential switch capacitor input sampling stage circuit 552 and a differential switch capacitor output stage circuit 554. The output stage circuit 554 is representative of the internal discharging process within a larger circuit block such as an integrator, amplifier, or filter. The actual circuitry inside output stage circuit 554 may be different, but the net effect may be the same as shown in FIG. 5B.

The differential switch capacitor input sampling stage circuit 552 may include a precharge buffer 556, a precharge switch-capacitor circuit 558, fine sampling switches 576 and 584, input sampling capacitors 560 and 590, and switches 580, 582, and 583. The precharge buffer 556 may include two buffer amplifiers. One of the buffer amplifiers is configured to buffer an input voltage Vip. In other words, one of the buffer amplifiers of precharge buffer 556 is configured to provide electrical impedance transformation of the signal Vip and output the voltage Vibp. The second of the buffer amplifiers is configured to buffer an input voltage Vin. In other words, the second of the buffer amplifiers of precharge buffer 556 is configured to provide electrical impedance transformation of the signal Vin and output the voltage Vibn.

The voltages Vip and Vin may be differential voltages. Hence, the voltages Vip and Vin may be a pair of the same voltage signal, except that the differential pair of signals are 180 degrees out of phase with each other. Thus, the amplitude of the two signals Vip and Vin that make up the differential voltage is the same; however, the phase of the two signals is different. Therefore, the voltage Vip may be referred to as a positive input voltage and the voltage Vin may be referred to as a negative input voltage. Similarly, the buffer amplifier output voltages Vibp and Vibn may be differential voltages. The precharge switch-capacitor circuit 558 may include the switches 562-566, 586, 588, and 594, the capacitor connecting switch 568, the coarse sampling switches 574 and 592, and capacitors 570 and 572.

In contrast to circuit of FIG. 2B, which transfers the required charge from capacitor 270 and 272 to input sampling capacitors 260 and 290 in a single step during phase P1c, the differential precharge switch-capacitor circuit 558 of FIG. 5B transfers the required charge from capacitors 570 and 572 to input sampling capacitors 560 and 590 in two separate steps. The first step, which occurs during a subset of the coarse sampling time (phase P1ca), transfers the first portion of the charge from parallel-connected capacitors 570 and 572 to input sampling capacitors 560 and 590 through coarse sampling switches 574 and 592 and switches 588, 594, 580, and 582. The second step, which occurs during a second subset of the coarse sampling time (phase P1cb), transfers the second portion of the charge from series-connected capacitors 570 and 572 to input sampling capacitors 560 and 590 through coarse sampling switches 574 and 592, capacitor connecting switch 568, and switches 580 and 582.

The differential configuration shown in FIG. 5B first samples the precharge buffer output (Vibp and Vibn) on precharge switch-capacitor circuit 558 capacitors 570 and 572 through switches 562, 564, 566, and 586 for the duration of phase P3. Thus, during the duration of P3, switches 562-566 and 586 are closed. A first portion of the charge stored on capacitors 570 and 572 is then transferred to input sampling capacitors 560 and 590 through coarse sampling switches 574 and 592 and switches 588, 594, 580, and 582 during P1ca. Thus, during P1ca, coarse sampling switches 574 and 592 and switches 588, 594, 580, and 582 are closed while switches 562-566, 586, and 583, fine sampling switches 576 and 584, capacitor connecting switch 568, and modeling switches 578 and 598 of the output stage circuit 554 are open. Hence, the capacitors 570 and 572 are connected in parallel during P1ca. A second portion of the charge from capacitors 570 and 572 is then transferred to input sampling capacitors 560 and 590 through coarse sampling switches 574 and 592, capacitor connecting switch 568, and switches 580 and 582 during phase P1cb. Thus, during P1cb, coarse sampling switches 574 and 592 capacitor connecting switch 568, and switches 580 and 582 are closed while switches 562-566, 586, 583, 588 and 594, fine sampling switches 576 and 584, and modeling switches 578 and 598 of the output stage circuit 554 are open. Hence, the capacitors 570 and 572 are connected in series during P1cb. The input (Vip and Vin) is then fine sampled during the fine sampling time (phase P1f) on the input sampling capacitors 560 and 590 through fine sampling switches 576 and 584 and switches 580 and 582 for the duration of phase P1f. Thus, during P1f, the fine sampling switches 576 and 584 and switches 562-566, 586, 580, and 582 are closed while coarse sampling switches 574 and 592, capacitor connecting switch 568, switches 583,588, and 594, and modeling switches 578 and 598 of the output stage circuit 554 are open. Hence, the capacitors 570 and 572 are connected in parallel during P1f. The charge stored on input sampling capacitors 560 and 590 during the coarse and fine sampling process is then transferred during the charge transfer time (phase P2) to the output stage circuit 554 modeled by switches 583, 578, and 598. Thus, during phase P2, the modeling switches 578 and 598 of the output stage circuit 554 and switches 562-566, 586, and 583 are closed while the fine sampling switches 576 and 584, coarse sampling switches 574 and 592, capacitor connecting switch 568, and switches 580, 582, 588, and 594 are open. This coarse/fine sampling and charge transfer process repeats with sampling period (ts).

Figure 6:
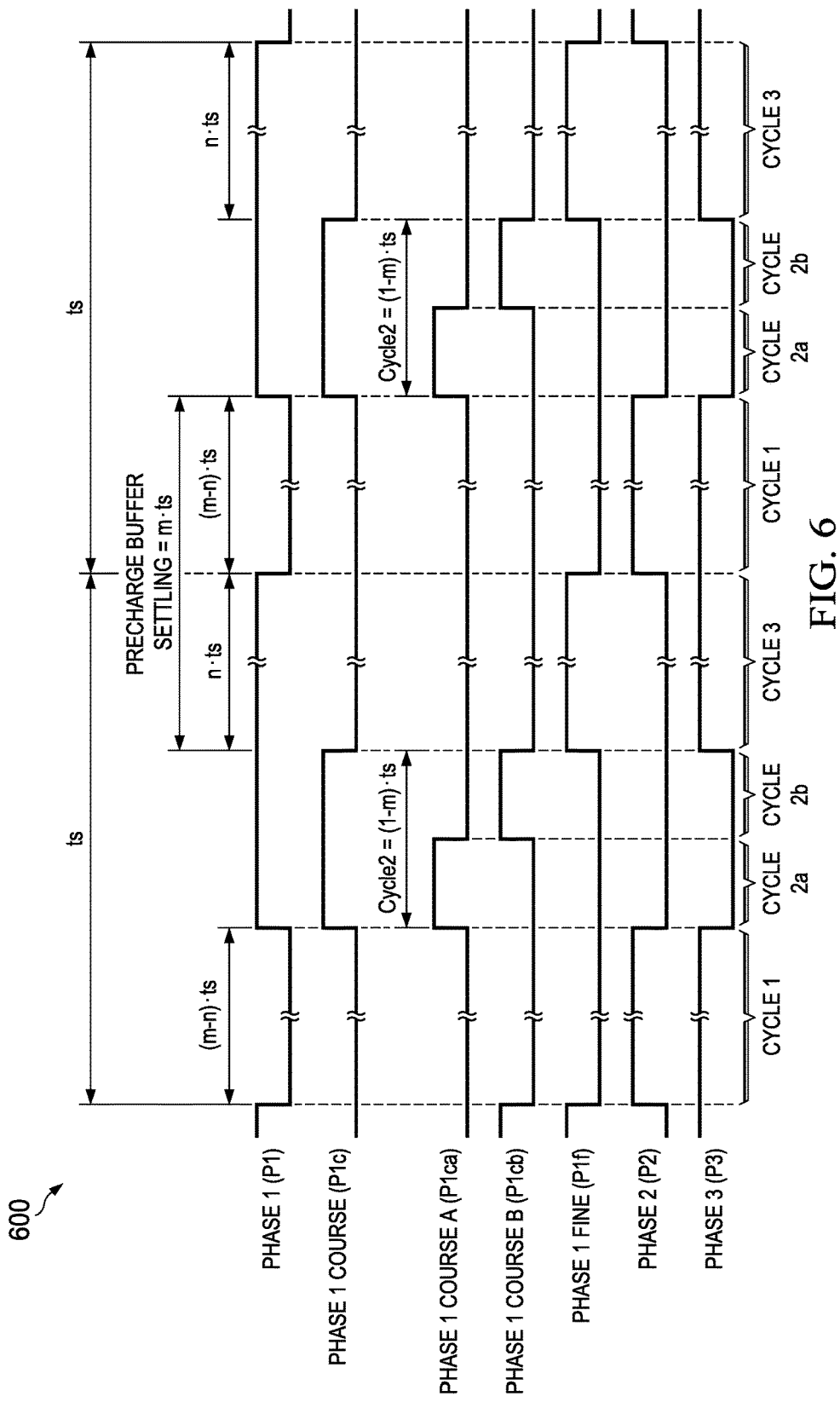
FIG. 6 shows an illustrative timing diagram of switch timing for switches in a switch-capacitor circuit in accordance with various embodiments.

FIG. 6 shows an illustrative timing diagram 600 of switch timing for switches in switch-capacitor circuit 104 in accordance with various embodiments. More particularly, the timing diagram 600 shows the timing of when the various phases discussed above occur. A HIGH signal in timing diagram 600 indicates that the corresponding phase is occurring and, thus, the switches are closed or open as discussed above. As shown in timing diagram 600, the switch-capacitor circuit 104 goes through three cycles (cycles 1, 2, and 3). The three cycles correspond with times when the switches may open or close. For example, cycle 1 corresponds to phase 2 (the charge transfer time when charge stored on the input sampling capacitor 510 from FIG. 5A and/or input sampling capacitors 560 and 590 from FIG. 5B is transferred to the output stage circuit). In addition to corresponding to phase 2, cycle 1 also corresponds with phase 3 (the time the precharge buffer 506 from FIG. 5A and 556 from FIG. 5B settles) because phase 3 occurs at all times except during the coarse sampling time. Cycle 1 lasts for a duration that may be defined by (m·n)·ts where ts is sampling period, m is the percent of the sampling period that a precharge buffer is settling (i.e., the percent of the sampling period that includes phase 3), and n is the percent of the sampling period that includes the fine sampling time (i.e., the percent of the sampling period that includes P1f).

Cycle 2 includes two subset cycles, 2a and 2b. Cycle 2a corresponds with P1ca (the first step of the coarse sampling time). In addition to corresponding to P1ca, cycle 2a also corresponds with phase 1 (the time that voltage is being sampled onto the input sampling capacitor 510 from FIG. 5A or input sampling capacitors 560 and 590 from FIG. 5B) and P1c. Cycle 2b corresponds with P1cb (the second step of the coarse sampling time). In addition to corresponding to P1cb, cycle 2b also corresponds with phase 1 and P1c. Cycle 2 lasts for a duration that may be defined by (1-m)·ts. Cycle 3 corresponds with P1f (the fine sampling time). In addition to corresponding to P1f, cycle 3 also corresponds with phase 1 and phase 3. Cycle 3 lasts for a duration that may be defined by n·ts. By providing suitable switch timing which allows for the precharge buffer to settle its output for much larger fraction of sampling period (m), switch-capacitor circuit 104 provides the benefit of increasing the input impedance of the switched-capacitor circuit while at the same time minimizing the power dissipation of the precharge buffer.

Figure 7:
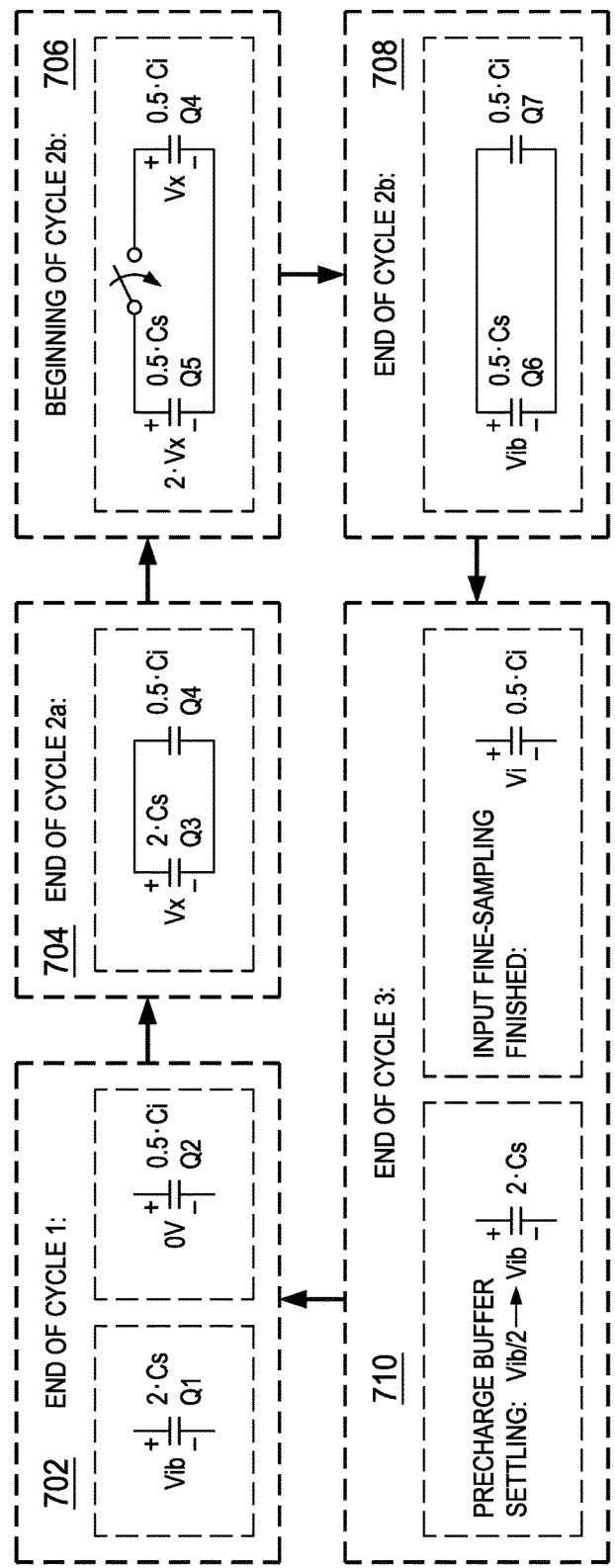
FIG. 7 shows an illustrative block diagram of time events and associated states of capacitor voltages and charges in a switch-capacitor circuit in accordance with various embodiments.

FIG. 7 shows an illustrative block diagram of time events 702-710 and associated states of capacitor voltages and charges in a switch-capacitor circuit 104 described in FIGS. 5A and 5B in accordance with various embodiments. For proper operation of the switch-capacitor circuit 104, it is necessary to size the capacitors 520-522 correctly relative to the input sampling capacitor 510 from FIG. 5A and the capacitors 570-572 correctly relative to input sampling capacitors 560 and 590 from FIG. 5B. There are five separate time events 702-710 and associated states of all capacitor voltages and charges. For simplification, the following substitutions are used throughout the discussion of FIG. 7 which focuses on the differential design shown in FIG. 5B: $C_{570}$ (capacitance of capacitor 570)=$C_{572}$ (capacitance of capacitor 572)=Cs and $C_{560}$ (capacitance of capacitor 560)=$C_{590}$ (capacitance of capacitor 590)=Ci.

First event 702 is at the end of cycle 1 during which equivalent capacitor 2·Cs (as capacitors 570 and 572 are in parallel) has sampled precharge buffer output voltage Vib and equivalent capacitor 0.5·Ci (as the capacitors 560 and 590 are in series) has been discharged by the output stage circuit to 0V. The charges on the capacitors are:

$$Q1 = 2 \cdot Cs \cdot Vib \quad (8)$$

$$Q2 = 0 \quad (9)$$

where Q1 is the charge on the equivalent capacitor 2·Cs and Q2 is the charge on the equivalent capacitor 0.5·Ci at the end of cycle 1.

Second event 704 is at the end of cycle 2a during which a portion of the charge from the parallel-connected capacitors 570 and 572, with an equivalent value of 2·Cs, has been transferred to equivalent capacitor 0.5·Ci (as the capacitors 560 and 590 are in series). This results in an intermediate voltage Vx across equivalent capacitors 2·Cs and 0.5·Ci. The resulting charges are:

$$Q3 = 2 \cdot Cs \cdot Vx \quad (10)$$

$$Q4 = 0.5 \cdot Ci \cdot Vx \quad (11)$$

where Q3 is the charge on the equivalent capacitor 2·Cs and Q4 is the charge on the equivalent capacitor 0.5·Ci at the end of cycle 2a. From the charge conservation principle:

$$Q1 + Q2 = Q3 + Q4 \quad (12)$$

Substituting Equations 8-11 in Equation 12 and solving for Vx results in:

$$Vx = \frac{2 \cdot Cs}{2 \cdot Cs + 0.5 \cdot Ci} \cdot Vib \quad (13)$$

Third event 706 is at the beginning of cycle 2b during which capacitors 570 and 572 have been connected in series with an equivalent capacitor value of 0.5·Cs. The voltage across the equivalent capacitor 0.5·Cs is 2·Vx with a resulting charge of:

$$Q5 = Cs \cdot Vx \quad (14)$$

Fourth event 708 is at the end of cycle 2b during which equivalent capacitors 0.5·Cs and 0.5·Ci have been connected in parallel and the desired voltage Vib is assumed across them. The charges on the capacitors are:

$$Q6 = 0.5 \cdot Cs \cdot Vib \quad (15)$$

$$Q7 = 0.5 \cdot Ci \cdot Vib \quad (16)$$

where Q6 is the charge on the equivalent capacitor 0.5·Cs and Q7 is the charge on the equivalent capacitor 0.5·Ci at the end of cycle 2b. From the charge conservation principle:

$$Q5 + Q4 = Q6 + Q7 \quad (17)$$

Substituting Equations 11, 13-16 in Equation 17 and solving for Cs results in:

$$Cs = 0.6404 \cdot Ci \quad (18)$$

Thus, the capacitors 570 and 572 are equal in capacitance to each other and approximately 0.6404 times the capacitance of input sampling capacitors 560 and 590. In other words, the capacitors 570 and 572 are approximately 64% the capacitance of capacitors 560 and 590. Substituting Equation 18 in Equation 13 and solving for Vx results in:

$$Vx = 0.7192 \cdot Vib \quad (19)$$

Fifth event 710 is at the end of cycle 3 during which the equivalent input-sampling capacitor 0.5·Ci has finished the fine sampling process. At this time the equivalent 2·Cs capacitor is still settling from Vib/2 to Vib.

Applying the above analysis (Equations 8-17) to the single-ended configuration of FIG. 5A results in the same relative capacitances of the capacitors 520-522 and half the input sampling capacitor 510. Thus, because there is only a single input sampling capacitor, $C_{520}=C_{522}=0.5 \cdot 0.6404 \cdot C_{510}$.

Peak voltage ($V_{PEAK}$) of 2·Vx across series-connected capacitors 520-522 from FIG. 5A and capacitors 570-572 from FIG. 5B is used at the beginning of cycle 2b. $V_{PEAK}=2 \cdot Vx$ has been used to simplify the calculations in Equations 14-19. In a real switch-capacitor circuit 104, as shown in FIG. 5B, $V_{PEAK}=2 \cdot Vx$ represents an upper limit value of the voltage which would be approached when RON ($S_{574}+S_{592}+S_{580}+S_{582}$)>>RON ($S_{568}$), where RON refers to switch on-resistance. However, since it is desirable to minimize $V_{PEAK}$, the circuit of FIG. 5B is normally designed such that RON ($S_{574}+S_{592}+S_{580}+S_{582}$) RON ($S_{568}$). Practical implementation of FIG. 5B design may, in an embodiment, result in $V_{PEAK}$ reduction factor of about 0.75 and therefore $V_{PEAK} \approx 0.75 \cdot 2 \cdot Vx$, where Vx≈0.72·Vib (Equation 19). Practical implementations of switch-capacitor circuit 104 of FIGS. 5A and 5B, therefore, have $V_{PEAK} \approx 1.08 \cdot Vib$. As discussed above, for a system requiring full-scale input Vi to be close to, equal to, or slightly above $V_{DD}$, potential charge leakage is prevented. Even though $V_{PEAK}$ is still slightly above Vib, it is not sufficiently high to cause charge leakage. For example, consider a system which requires full-scale input Vi=$V_{DD}$=5V. In this system $V_{PEAK} \approx 1.08 \cdot 5$ V≈5.4V, $V_{PEAK}$ exceeds $V_{DD}$ by about 0.4V which is not sufficient to cause charge leakage from PMOS switch diodes with typical turn-on voltage in 0.6V to 0.7V range.

Similar to the switch-capacitor circuit 104 shown in FIGS. 2A and 2B, the switch-capacitor circuit 104 in FIGS. 5A and 5B provides a much longer time, in some embodiments about 0.95·ts, for precharge buffer settling during phase 3. Since the precharge buffer settling time is increased in comparison to the precharge buffer settling time of the conventional switch-capacitor circuit (typically about 0.125·ts), precharge buffer power dissipation can be reduced by a factor of approximately 14. Furthermore, the fine sampling phase is also lengthened, in some embodiments to approximately 0.45·ts from the conventional switch-capacitor circuit fine sampling time (typically about 0.375·ts) providing a 20% increase in fine sampling time. Additionally, because the capacitors 520-522 may be smaller than 0.5 times the input sampling capacitor 510 from FIG. 5A and capacitors 570-572 from FIG. 5B may be smaller than the input sampling capacitors 560 and 590, a smaller silicon area, in some embodiments, approximately 36%, may be achieved in comparison to the switch-capacitor circuit 104 in FIGS. 2A and 2B.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. An analog-to-digital system, comprising:
   an input sampling stage circuit that includes:
      a precharge buffer configured to buffer an input voltage;
      a precharge switch-capacitor circuit including a plurality of switches, a first capacitor, and a second capacitor configured such that the first and second capacitors are connected in series during a coarse sampling time and in parallel during a fine sampling time and charge transfer time; and
      a first input sampling capacitor configured to sample the input voltage through the precharge switch-capacitor circuit during the coarse sampling time and sample the input voltage directly during the fine sampling time; and
   an analog-to-digital converter (ADC) wherein the ADC is coupled to the input sampling stage circuit.

2. The analog-to-digital system of claim 1, wherein the input sampling stage circuit further includes a fine sampling switch connected between the input voltage and the first input sampling capacitor, the fine sampling switch configured to be closed during the fine sampling time and open during the coarse sampling time and charge transfer time.

3. The analog-to-digital system of claim 2, wherein the plurality of switches includes a first coarse sampling switch and capacitor connecting switch connecting the first and second capacitors in series to the first input sampling capacitor, wherein the first coarse sampling switch and the capacitor connecting switch are configured to be closed during the coarse sampling time and open during the fine sampling time and charge transfer time.

4. The analog-to-digital system of claim 3, wherein:
   the fine sampling switch is configured to be open during a charge transfer time;
   and
   the first input sampling capacitor is configured to discharge stored charge to an output stage circuit during the charge transfer time.

5. The analog-to-digital system of claim 4, wherein the precharge buffer is configured to settle during the fine sampling time and the charge transfer time.

6. The analog-to-digital system of claim 5, wherein the plurality of switches further includes:
   a first switch connected to the precharge buffer, the first coarse sampling switch, and the first capacitor;
   a second switch connected to the precharge buffer, a capacitor connecting switch, and the second capacitor; and
   a third switch connected to ground, the capacitor connecting switch, and the first capacitor;
      wherein the capacitor connecting switch connects between the first and second capacitor.

7. The analog-to-digital system of claim 6, wherein:
   the first, second, and third switches are configured to be closed during the fine sampling time and the charge transfer time;
   the capacitor connecting switch is configured to be closed during the coarse sampling time.

8. The analog-to-digital system of claim 5, wherein:
   the precharge buffer includes a first buffer amplifier configured to buffer the input voltage, the input voltage being a positive input voltage, and a second buffer amplifier configured to buffer a negative input voltage, the positive input voltage and the negative input voltage comprising a differential signal; and the plurality of switches further includes:
a first switch connected to the first buffer amplifier, the first coarse sampling switch, and the first capacitor;
a second switch connected to the first buffer amplifier, a capacitor connecting switch, and the second capacitor;
a third switch connected to the second buffer amplifier, the capacitor connecting switch, and the first capacitor; and
a fourth switch connected to the second buffer amplifier, the second capacitor, and second coarse sampling switch;
wherein the capacitor connecting switch connects between the first and second capacitor.

9. The analog-to-digital system of claim 8, wherein the input sampling stage circuit further includes a second input sampling capacitor connected to the second coarse sampling switch, the second coarse sampling switch configured to be closed during the coarse sampling time.

10. The analog-to-digital system of claim 9, wherein the input sampling stage circuit further includes a second fine sampling switch connected to the second coarse sampling switch and the second input sampling capacitor, the second fine sampling switch configured to be closed during the fine sampling time.

11. A analog-to-digital system, comprising:
an input sampling stage circuit that includes:
a precharge buffer configured to buffer an input voltage;
a precharge switch-capacitor circuit including a plurality of switches, a first capacitor, and a second capacitor configured such that the first and second capacitors are connected in parallel during a first portion of a coarse sampling time, in series during a second portion of the coarse sampling time, and in parallel during a fine sampling time and charge transfer time; and
a first input sampling capacitor configured to sample the input voltage through the precharge switch-capacitor circuit during the coarse sampling time and sample the input voltage directly during the fine sampling time; and
an analog-to-digital converter (ADC) wherein the ADC is coupled to the input sampling stage circuit.

12. The analog-to-digital system of claim 11, wherein:
the input sampling stage circuit further includes a fine sampling switch connected between the input voltage and the first input sampling capacitor, the fine sampling switch configured to be closed during the fine sampling time and open during the coarse sampling time and charge transfer time; and
the plurality of switches includes a first coarse sampling switch and capacitor connecting switch connecting the first and second capacitors in series to the first input sampling capacitor.

13. The analog-to-digital system of claim 12, wherein:
the fine sampling switch and the first coarse sampling switch are configured to be open during a charge transfer time;
the first input sampling capacitor is configured to discharge stored charge to the output stage circuit during the charge transfer time; and
the precharge buffer is configured to settle during the fine sampling time and the charge transfer time.

14. The analog-to-digital system of claim 13, wherein the plurality of switches further includes:
a first switch connected to the precharge buffer, the first coarse sampling switch, and the first capacitor;
a second switch connected to the precharge buffer, a capacitor connecting switch, the second capacitor, and a first phase one coarse sampling switch, the first phase one coarse sampling switch additionally connected to the first coarse sampling switch, fine sampling switch, and first input sampling capacitor; and
a third switch connected to ground, the capacitor connecting switch, the first capacitor, and a second phase one coarse sampling switch, the second phase one coarse sampling switch additionally connected to ground;
wherein the capacitor connecting switch connects between the first and second capacitor.

15. The analog-to-digital system of claim 14, wherein:
the first, second, and third switches are configured to be closed during the fine sampling time and the charge transfer time;
the first and second phase one coarse sampling switches are configured to be closed during the first portion of the coarse sampling time; and
the capacitor connecting switch is configured to be closed during the second portion of the coarse sampling time, the second portion of the coarse sampling time being exclusive of the first portion of the coarse sampling time.

16. The analog-to-digital system of claim 13, wherein:
the precharge buffer includes a first buffer amplifier configured to buffer the input voltage, the input voltage being a positive input voltage, and a second buffer amplifier configured to buffer a negative input voltage, the positive input voltage and the negative input voltage comprising a differential signal;
the plurality of switches further includes:
a first switch connected to the first buffer amplifier, the first coarse sampling switch, and the first capacitor;
a second switch connected to the first buffer amplifier, a capacitor connecting switch, the second capacitor, and a first phase one coarse sampling switch, the first phase one coarse sampling switch additionally connected to the first coarse sampling switch, fine sampling switch, and first input sampling capacitor; and
a third switch connected to the second buffer amplifier, the capacitor connecting switch, the first capacitor, and a second phase one coarse sampling switch, the second phase one coarse sampling switch further connected to a second coarse sampling switch, second fine sampling switch, and second input sampling capacitor; and
a fourth switch connected to the second buffer amplifier, the second capacitor, and the second coarse sampling switch;
wherein the capacitor connecting switch connects between the first and second capacitor.

17. The analog-to-digital system of claim 16, wherein the input sampling stage circuit further includes the second input sampling capacitor connected to the second coarse sampling switch, the second coarse sampling switch configured to be closed during the coarse sampling time.

18. The analog-to-digital system of claim 17, wherein the input sampling stage circuit further includes a second fine sampling switch connected to the second coarse sampling switch and the second input sampling capacitor, the second fine sampling switch configured to be closed during the fine sampling time.

* * * * *